United States Patent
Pillarisetty et al.

(10) Patent No.: US 11,195,839 B2
(45) Date of Patent: *Dec. 7, 2021

(54) 2S-1C 4F² CROSS-POINT DRAM ARRAY

(71) Applicant: Intel Corporation, Santa Clara, CA (US)

(72) Inventors: Ravi Pillarisetty, Portland, OR (US); Abhishek A. Sharma, Hillsboro, OR (US); Prashant Majhi, San Jose, CA (US); Elijah V. Karpov, Portland, OR (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/635,966

(22) PCT Filed: Sep. 29, 2017

(86) PCT No.: PCT/US2017/054276
§ 371 (c)(1),
(2) Date: Jan. 31, 2020

(87) PCT Pub. No.: WO2019/066893

PCT Pub. Date: Apr. 4, 2019

(65) Prior Publication Data

US 2020/0243543 A1 Jul. 30, 2020

(51) Int. Cl.
*H01L 27/108* (2006.01)
*G11C 11/4096* (2006.01)
*G11C 14/00* (2006.01)

(52) U.S. Cl.
CPC .... *H01L 27/10897* (2013.01); *G11C 11/4096* (2013.01); *G11C 14/0009* (2013.01); *G11C 14/0027* (2013.01); *H01L 27/10894* (2013.01)

(58) Field of Classification Search
CPC ......... H01L 27/10897; H01L 27/10894; H01L 45/00; H01L 27/108; G11C 14/0027;
(Continued)

(56) References Cited

U.S. PATENT DOCUMENTS

2006/0294425 A1* 12/2006 Kollner ................ G01R 31/52
714/30
2010/0073997 A1* 3/2010 Elmegreen ............ H01L 45/06
365/157

(Continued)

OTHER PUBLICATIONS

International Search Report and Written Opinion for International Patent Application No. PCT/US2017/054276 dated Jun. 28, 2018, 12 pgs.

(Continued)

*Primary Examiner* — Fernando Hidalgo
(74) *Attorney, Agent, or Firm* — Schwabe, Williamson & Wyatt, P.C.

(57) ABSTRACT

A memory device comprises a first selector and a storage capacitor in series with the first selector. A second selector is in parallel with the storage capacitor coupled between the first selector and zero volts. A plurality of memory devices form a 2S-1C cross-point DRAM array with 4F2 or less density.

23 Claims, 8 Drawing Sheets

(58) Field of Classification Search
CPC ............ G11C 14/0009; G11C 11/4096; G11C 2213/74; G11C 2213/76; G11C 13/003; G11C 14/0045; G11C 11/4045
USPC ........................................................ 365/149
See application file for complete search history.

(56) References Cited

U.S. PATENT DOCUMENTS

| | | |
|---|---|---|
| 2011/0199814 A1 | 8/2011 | Meade |
| 2013/0194010 A1 | 8/2013 | Ueki et al. |
| 2016/0064391 A1 | 3/2016 | Li et al. |
| 2016/0111639 A1 | 4/2016 | Wells et al. |
| 2017/0018570 A1 | 1/2017 | Lue et al. |
| 2018/0226963 A1* | 8/2018 | Asam .................. H03K 17/063 |

OTHER PUBLICATIONS

International Preliminary Report on Patentability for International Patent Application No. PCT/US2017/054276 dated Apr. 9, 2020, 8 pgs.

* cited by examiner

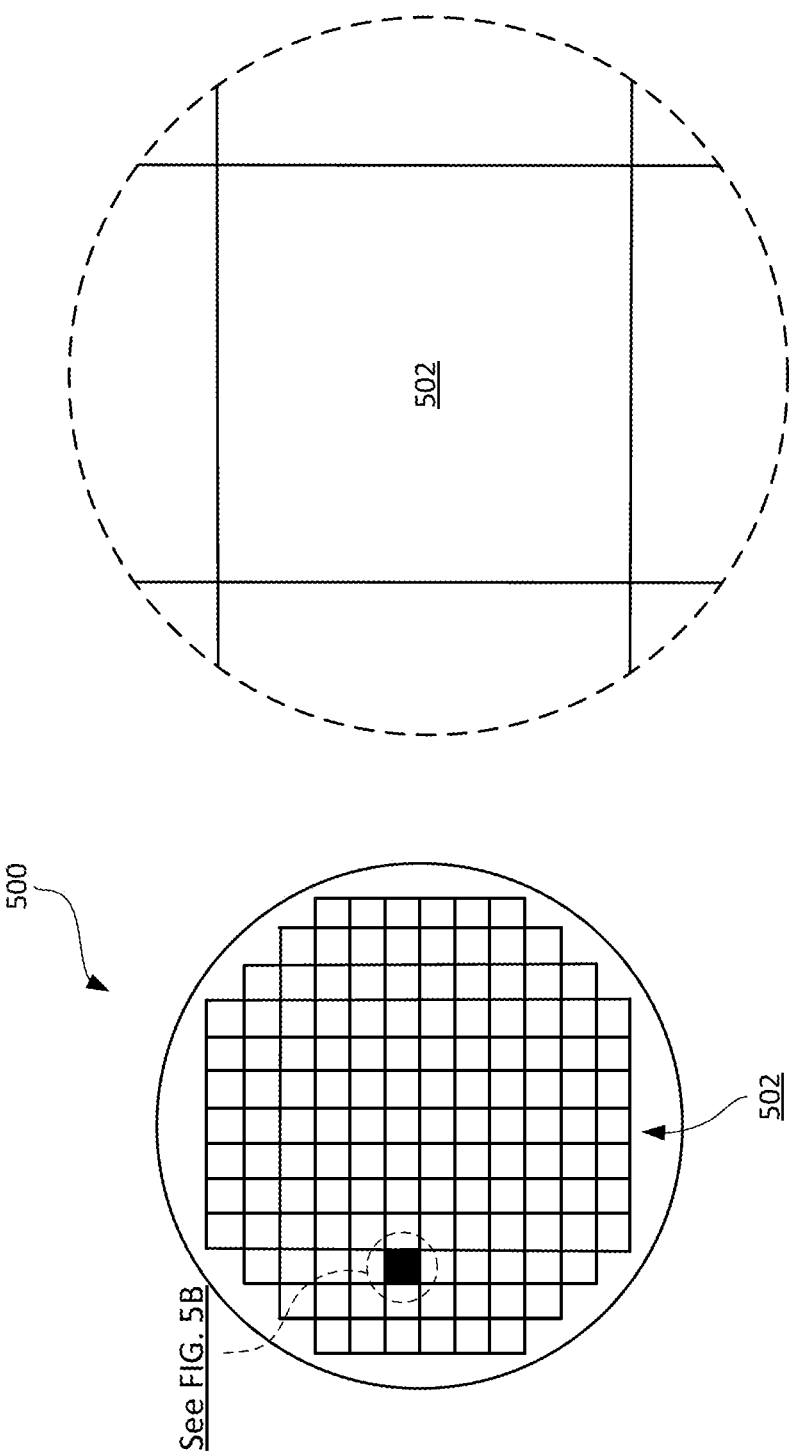

2S-1C 4F² CROSS-POINT DRAM ARRAY

CROSS-REFERENCE TO RELATED APPLICATION

This patent application is a U.S. National Phase Application under 35 U.S.C. § 371 of International Application No. PCT/US2017/054276, filed Sep. 29, 2017, entitled "2S-1C 4F2 CROSS-POINT DRAM ARRAY," which designates the United States of America, the entire disclosure of which is hereby incorporated by reference in its entirety and for all purposes.

TECHNICAL FIELD

Embodiments of the disclosure are in the field of integrated circuit structures and, in particular, a 2S-1C 4F² cross-point DRAM array.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend density through such processes. Consequently, fabrication of the functional components needed for future technology nodes may require the introduction of new methodologies or the integration of new technologies in current fabrication processes or in place of current fabrication processes.

Thus, significant improvements are still needed in the area of memory device manufacture and operation.

BRIEF DESCRIPTION OF THE DRAWINGS

FIGS. 5A and 5B are top views of a wafer and dies that include one or more 2S-1C a cross-point DRAM arrays, in accordance with one or more of the embodiments disclosed herein.

DESCRIPTION OF THE EMBODIMENTS

Figure 1A:
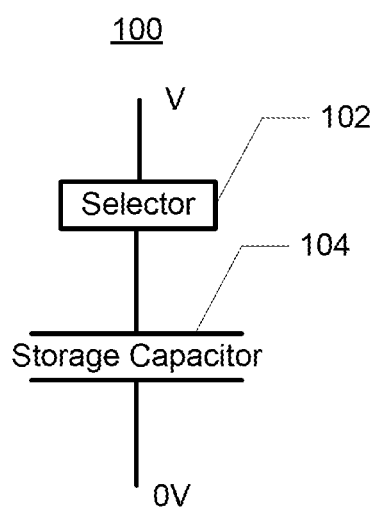
FIG. 1A illustrates a schematic representation of a hypothetical 1S-1C cell.

A 2S-1C 4F² cross-point DRAM array is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with an embodiment of the present disclosure, one or more embodiments are directed to structures and architectures for a two selector (2S)/one capacitor (1C) cell cross-point DRAM array. Such embodiments may have applications for one or more of cross-point memory, embedded memory, memory, and memory arrays.

To provide context, a state-of-the-art one transistor (1T)/one capacitor (1C) DRAM array includes cells having an access transistor in the front end. Peripheral circuitry for the 1T-1C DRAM array is also included in the front end. The cells further include a capacitor over a bit line (COB) higher in the stack in the silicon back end. The access transistor occupies valuable silicon real estate of the wafer. Consequently, the cells are relatively large in size. For example, a 1T-1C DRAM cell may have an area $8F^2$ (F: min. feat. size).

Methods for providing a denser 1C DRAM array are limited. One hypothetical method could be to replace the three terminal transistor with a two terminal selector. For example, NRAM and RRAM memories use a selector with a resistive memory to form a 1T-1R cell, which operates by changing resistance across a dielectric solid-state material. Accordingly, consider a hypothetical case where the access transistor in the 1T-1C cell is replaced with a selector to create a one selector (1S)/one capacitor (1C) cell, as shown in FIGS. 1A and 1B.

Figure 1B:
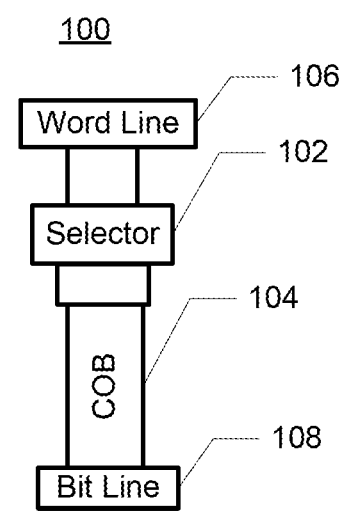
FIG. 1B illustrates a cross-section of the hypothetical 1S-1C.

FIG. 1A illustrates an electrical diagram of hypothetical 1S-1C cell, and FIG. 1B illustrates a cross-section of the hypothetical 1S–. As shown in FIG. 1A, the 1S-1C cell 100 includes a selector 102 coupled to a voltage (V) in series with a storage capacitor 104 connected to zero volts. As shown in FIG. 1B, the selector 102 may be coupled to a word line 106, while the storage capacitor 108 may be coupled to a bit line 108 (capacitor over a bit line (COB)).

One problem with creating such a hypothetical 1S-1C cell is that commercially available selector materials require a sufficient current flow through the selector 102 once triggered. For example, a conventional selector 102 may not become conductive unless a minimum of approximately 100 µA of current flows through the selector 102. The problem with attempting to create the 1S-1C 100 cell having the selector 102 in series with the capacitor 104 is that the capacitor 104 has a fairly high impedance or resistance so that the minimum amount of current flowing through the selector 102 will not be achieved. The result is that the selector will fail to "turn on" and there won't be a sufficient voltage drop cross capacitor 104 to be able to read or write the corresponding bit. Another problem with creating the 1S-1C cell 100 is that operation of such a cell may be too slow to be practical.

In accordance with an embodiment of the present disclosure, a transistor-less array, e.g. with $4F^2$ or less density, is fabricated using the back end of line (BEOL) processes and materials.

According to one or more embodiments, a memory element is provided comprising two selectors (2S) and one capacitor (1C). In a further embodiment, a cross-point array includes a 2S-1C memory element located a cross-section of each bit line and word line.

Figure 2A:
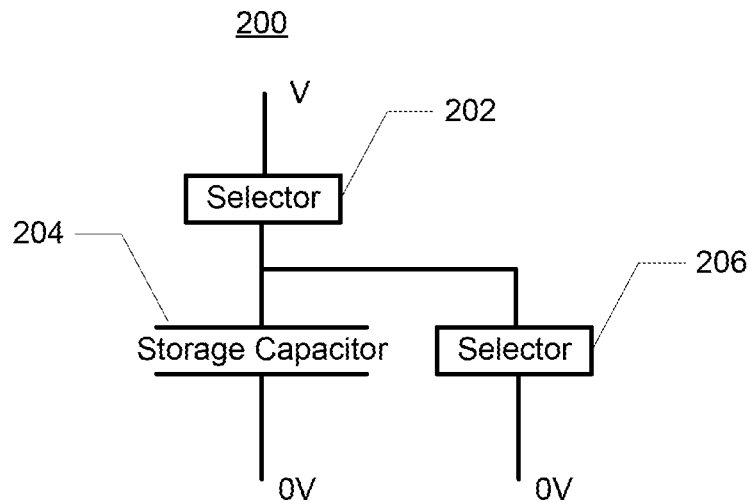
FIG. 2A illustrates a schematic representation of a 2S-1C memory element.
Figure 2B:
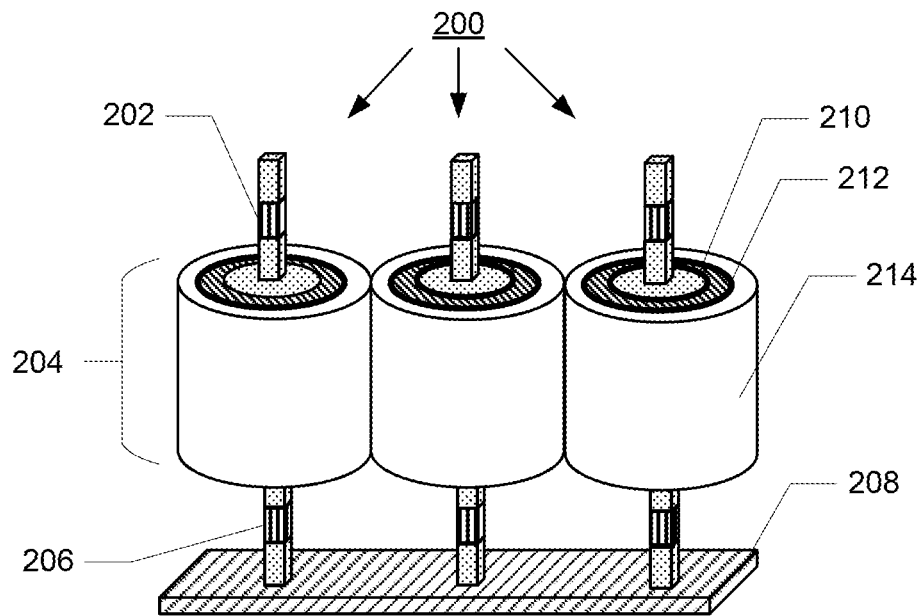
FIG. 2B illustrates an example of a row of 2S-1C memory elements.

FIG. 2A illustrates a schematic representation of a 2S-1C memory element, and FIG. 2B illustrates an example of a row of 2S-1C memory elements.

In one embodiment, the memory device 200 may include a top access selector 202 and a storage capacitor 204 in series with the access selector 202. A bottom bypass selector 206 in parallel with the storage capacitor 204 is coupled between the access selector 202 and zero volts. Both the storage capacitor 204 and the bypass selector 206 have a path to zero volts. In the embodiment shown in FIG. 2B showing a row of 2S-1C memory elements, the storage capacitor 204 and the bypass selector 206 are coupled to a conductive line 208, such as a bit line for example.

In one embodiment, the storage capacitor 204 may be implemented as a series of concentric cylinders. From smallest to largest, the concentric cylinders may include an inner cylinder comprising a metal internal node 210, a middle cylinder comprising a dielectric layer 212, and an outer cylinder comprising a metal layer 214. In one embodiment, the access selector 202 and the bypass selector 206 are connected via the internal node 210 of the storage capacitor 204.

According to the embodiments disclosed herein, the access selector 202 of each storage capacitor 204 is provided with a parallel path back to zero volts through the bypass selector 206. When the access selector 202 is triggered to turn on, the bypass selector 206 also turns on, which provides the access selector 202 with a very low resistance such that a sufficiently large current flows through both the access selector 202 and the bypass selector 206.

Figure 3:
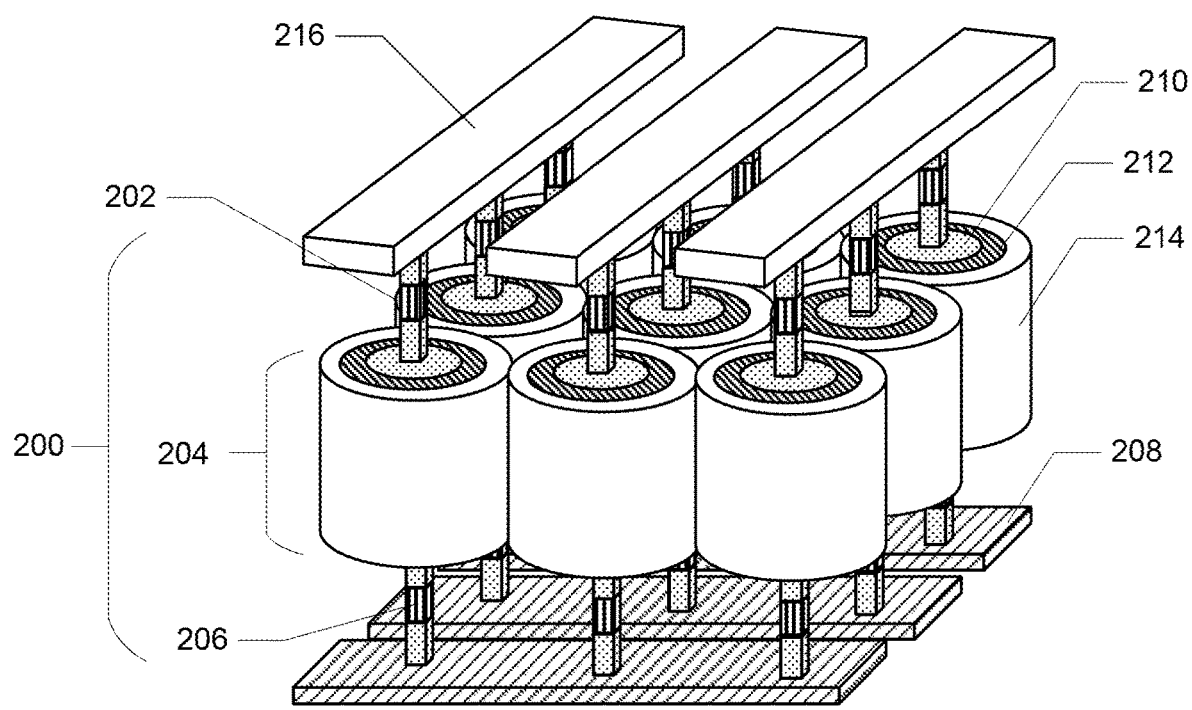
FIG. 3 illustrates an angled three-dimensional view of 2S-1C a cross-point DRAM array.

FIG. 3 illustrates an angled three-dimensional view of a 2S-1C cross-point DRAM array. More specifically, the disclosed embodiments provide a backend 2S-1C cross-point DRAM array 300 comprising a plurality of 1S-1C-1S memory elements 200.

Referring to FIG. 3, the 2S-1C cross-point array 300 includes a first plurality of conductive lines 216 along a first direction on a substrate. In an embodiment, the first plurality of conductive lines 216 is a plurality of word lines. A second plurality of conductive lines 208 is along a second direction on the substrate orthogonal to the first direction. In an embodiment, the second plurality of conductive lines 208 is a plurality of bit lines. Individual 1S-1C-1S memory elements 200 are located at cross-sections of the first plurality of conductive lines 216 and the second plurality of conductive lines 208. Individual ones of the plurality of 1S-1C-1S memory elements 200 comprise the access selector 202 and the storage capacitor 204 in series with the access selector 202. The memory elements 200 further include a bypass selector 206 in parallel with the storage capacitor 204 coupled between the access selector 202 and zero volts. In one embodiment, the plurality of storage capacitors 204 in the cross-point DRAM array 300 are all connected together through their respective outer cylinder metal layers 214 and tied to zero volts at an edge of the cross-point DRAM array 300.

Operation of each of the memory elements 200 is as follows. A "1" state is written to each memory device 200 by applying Vcc on a first conductive line 216 (e.g., the word line) to turn on both the access selector 202 and the bypass selector 206, and turning off Vcc (and consequently both selectors 202 and 206) to store V/2 in the storage capacitor 204. V/2 is stored in the storage capacitor 204 because the voltage is divided across both selectors 202 and 206.

Both selectors 202 and 206 are symmetric and operate in both positive and negative polarity with the same IV curve. A "0" state is written to the memory elements 200 in a similar manner, i.e., by applying –Vcc on the first conductive line 216 (e.g., the word line) to turn on both the access selector 202 and the bypass selector 206 to store –V/2 in the storage capacitor 204.

Each of the memory elements 200 is read by applying V/2 on the second conductive line 208 (e.g., the bit line), triggering both selectors 202-8206. A "0" state is read if both the access selector 202 and the bypass selector 206 turn on, and reading a "1" state otherwise.

In one embodiment, the selector element 104 has a thickness between 20 nanometers-60 nanometers, while the storage capacitor may have a size that ranges from 50×50 nm to 250×250 nm.

As an example of a general processing scheme, FIGS. 4A-4F illustrate cross-sectional views of various stages in a method of fabricating a cross-point 2S-1C memory element, in accordance with an embodiment of the present disclosure.

Figure 4A:
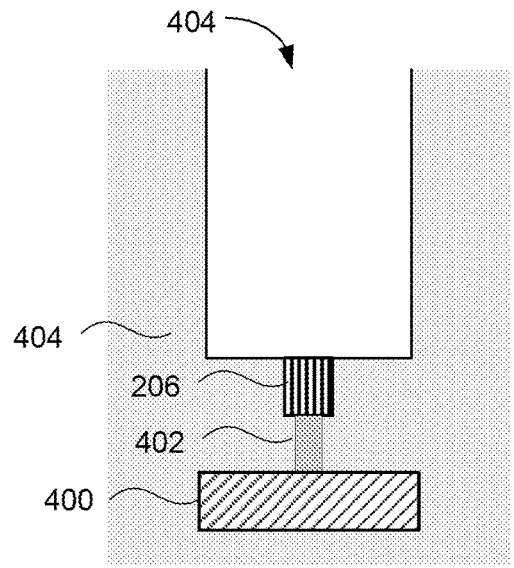
FIGS. 4A-4F illustrate cross-sectional views of various stages in a method of fabricating a cross-point 2S-1C memory element, in accordance with an embodiment of the present disclosure.

Referring to FIG. 4A, a method of fabricating the cross-point 2S-1C memory array includes forming the metal bit lines 400 in the back end (e.g., at a level 2) followed by forming a first plurality of vias 402 and the bypass selectors 206 over the bit lines 400. The first plurality of vias 402 are coupled to the bit lines 400 and the bypass selectors 206 are coupled between the first plurality of vias 402 and the storage capacitors 204. An inter-level dielectrics (ILD) layer 404, e.g., silicon dioxide, is deposited and the storage capacitor locations are defined by forming trenches in the ILD 404.

Figure 4B:
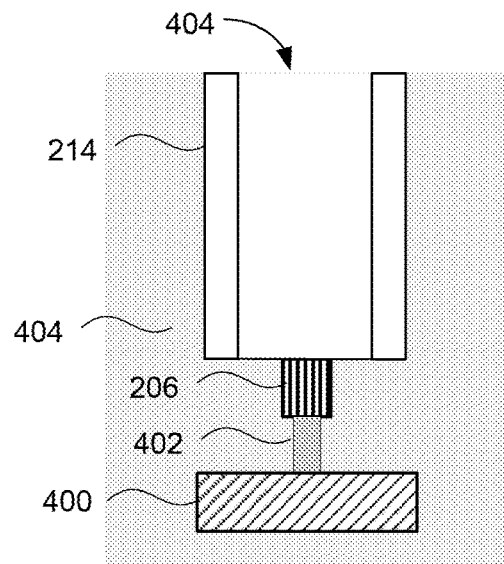
Figure 4C:
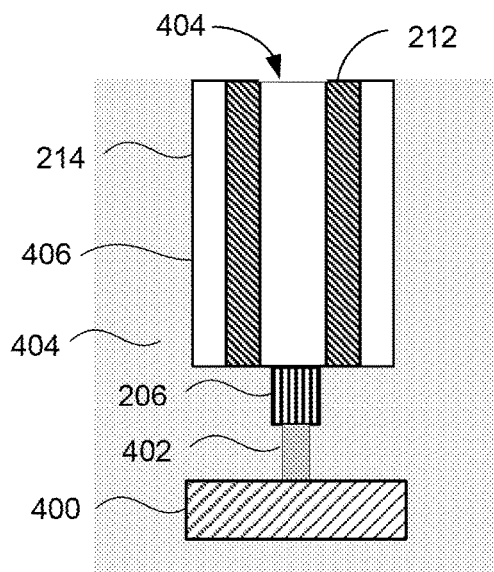
Figure 4D:
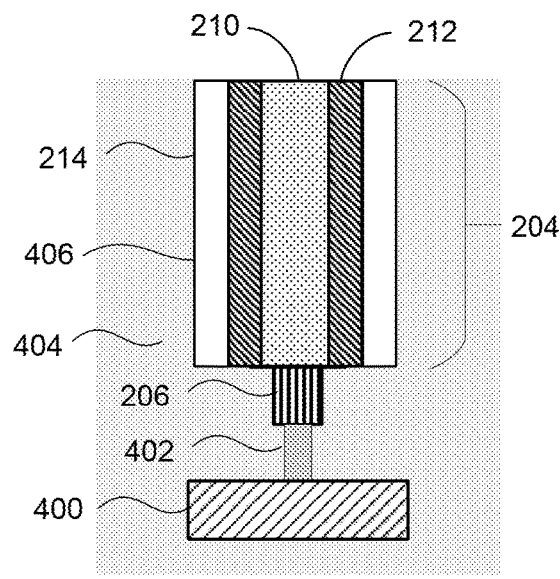

Referring to FIG. 4B, each of the storage capacitors 204 are formed by forming the outer cylinder comprising the metal layer 214 in the trench 404. Referring to FIG. 4C, the middle cylinder comprising the dielectric layer 212 is formed in the trench conformal to walls of the outer cylinder metal layer 214. Referring to FIG. 4D, the inner cylinder comprising the metal internal node 210 is formed conformal to walls of the dielectric layer 212, completing the storage capacitor 204.

Figure 4E:
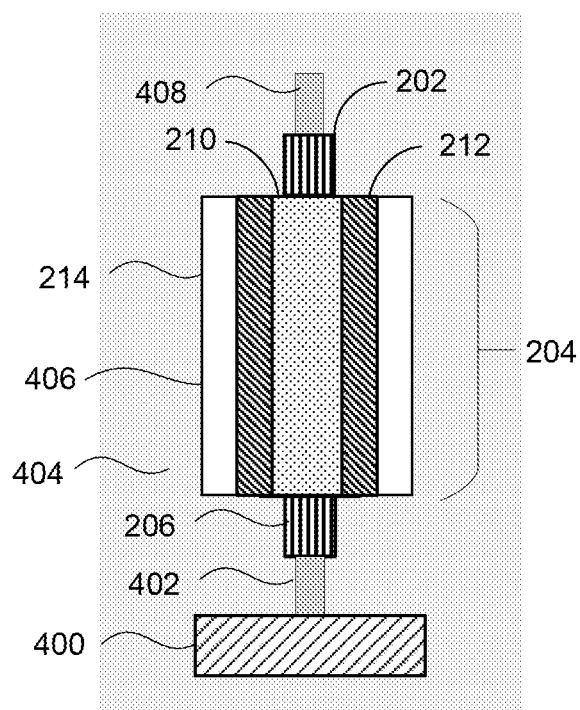
Figure 4F:
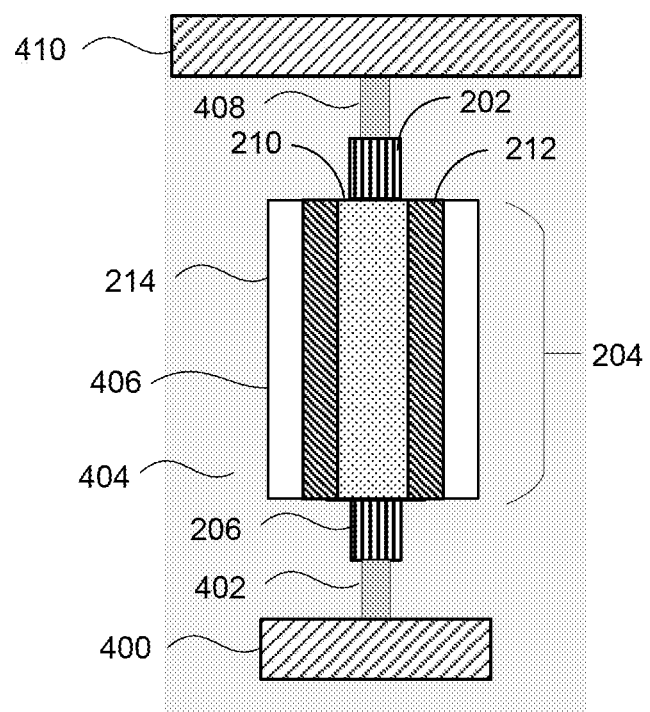

Referring to FIG. 4E, access selectors 202 and a second plurality of vias 408 are formed over the storage capacitors 204. The access selectors 202 are coupled to the storage capacitors 204 and the second plurality of vias 408 are coupled to the access selectors 202. Referring to FIG. 4F, metal word lines 410 are then formed (e.g., at level 4 or 5) on the second plurality of vias 408.

In a first example of suitable selector materials, in an embodiment, one or both of the access selector 202 and the bypass selector 206 include a ferroelectric oxide material. In an embodiment, the ferroelectric oxide material is selected from the perovskite group of generic composition $ABO_3$. In an embodiment, the ferroelectric oxide material 112 is selected from the group consisting of lead zirconate titanate (PZT), strontium bismuth tantalum oxide (SBT), and lanthanum-doped lead zirconium titanate (PLZT). In another embodiment, the ferroelectric oxide material 112 includes hafnium and oxygen, such as in the form of hafnium oxide or a metal-doped hafnium oxide. In an embodiment, the ferroelectric oxide material 112 switches polarization states based on a ferroelectric response to changing electric field. In another embodiment, the ferroelectric oxide material switches polarization states based on an anti-ferroelectric response to changing electric field.

In a second example of suitable selector materials, in an embodiment, one or both of the access selector 202 and the bypass selector 206 include an insulator metal transition material layer.

In a third example of suitable selector materials, in an embodiment, one or both of the access selector 202 and the bypass selector 206 include chalcogenides materials.

In a fourth example of suitable selector materials, in an embodiment, one or both of the access selector 202 and the bypass selector 206 include a a. In an embodiment, the semiconducting oxide material layer is one such as, but not limited to, indium gallium zirconium oxide (IGZO), tin oxide, antimony oxide, indium oxide, indium tin oxide, titanium oxide, zinc oxide, indium zinc oxide, gallium oxide, titanium oxynitride, ruthenium oxide, or tungsten oxide. In one embodiment, an IGZO layer is used and has a gallium to indium ratio of 1:1, a gallium to indium ratio greater than 1 (e.g., 2:1, 3:1, 4:1, 5:1, 6:1, 7:1, 8:1, 9:1, or 10:1), or a gallium to indium ratio less than 1 (e.g., 1:2, 1:3, 1:4, 1:5, 1:6, 1:7, 1:8, 1:9, or 1:10). A low indium content IGZO may refer to IGZO having more gallium than indium (e.g., with a gallium to indium ratio greater than 1:1), and may also be referred to as high gallium content IGZO. Similarly, low gallium content IGZO may refer to IGZO having more indium than gallium (e.g., with a gallium to indium ratio less than 1:1), and may also be referred to as high indium content IGZO.

It is to be appreciated that the access selector 202 and the bypass selector 206 need not be of the same material type.

In an embodiment, the conductive lines 208 and 216, such as bit lines and word lines described above, are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Conductive lines, such as bit lines and word lines described above, may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, lithographic operations may be performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described in association with embodiments herein are typically formed on or above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated as or on underlying lower level back end of line (BEOL) interconnect layers.

The integrated circuit structures described herein may be included in an electronic device. As an example of one such apparatus, FIGS. 5A and 5B are top views of a wafer and dies that include one or more 2S-1C a cross-point DRAM arrays, in accordance with one or more of the embodiments disclosed herein.

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more 2S-1C a cross-point DRAM arrays, such as described above. After the fabrication of the semiconductor product is complete, the wafer 500 may undergo a singulation process in which each of the dies 502 is separated from one another to provide discrete "chips" of the semiconductor product. In particular, structures that include embedded non-volatile memory structures having an independently scaled selector as disclosed herein may take the form of the wafer 500 (e.g., not singulated) or the form of the die 502 (e.g., singulated). The die 502 may include one or more 2S-1C a cross-point DRAM arrays and/or supporting circuitry to route electrical signals, as well as any other IC components. In some embodiments, the wafer 500 or the die 502 may include an additional memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
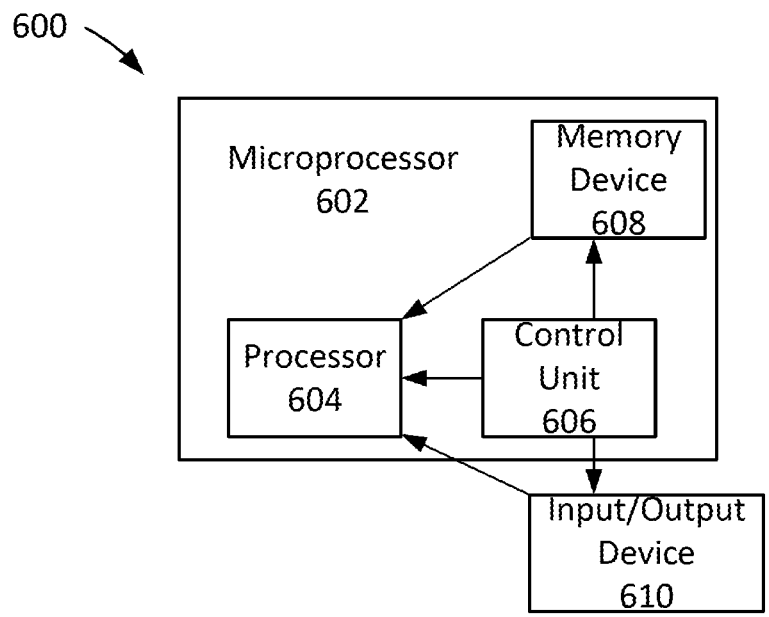
FIG. 6 illustrates a block diagram of an electronic system, in accordance with an embodiment of the present disclosure.

FIG. 6 illustrates a block diagram of an electronic system 600, in accordance with an embodiment of the present disclosure. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be appreciated that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a non-volatile memory cell as described in the present description. In an embodiment, the memory device 608 is embedded in the microprocessor 602, as depicted in FIG. 6. In an embodiment, the processor 604, or another component of electronic system 600, includes one or more 2S-1C a cross-point DRAM arrays such as those described herein.

Figure 7:
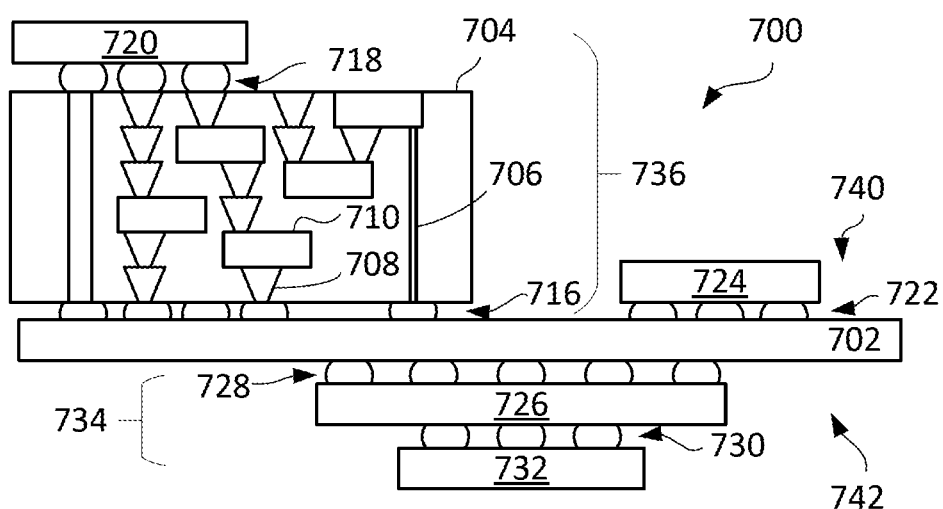
FIG. 7 is a cross-sectional side view of an integrated circuit (IC) device assembly that may include one or more 2S-1C memory elements, in accordance with one or more of the embodiments disclosed herein.

FIG. 7 is a cross-sectional side view of an integrated circuit (IC) device assembly that may include one or more 2S-1C memory elements, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of 2S-1C memory elements, such as disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 702 of FIG. 7B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Figure 8:
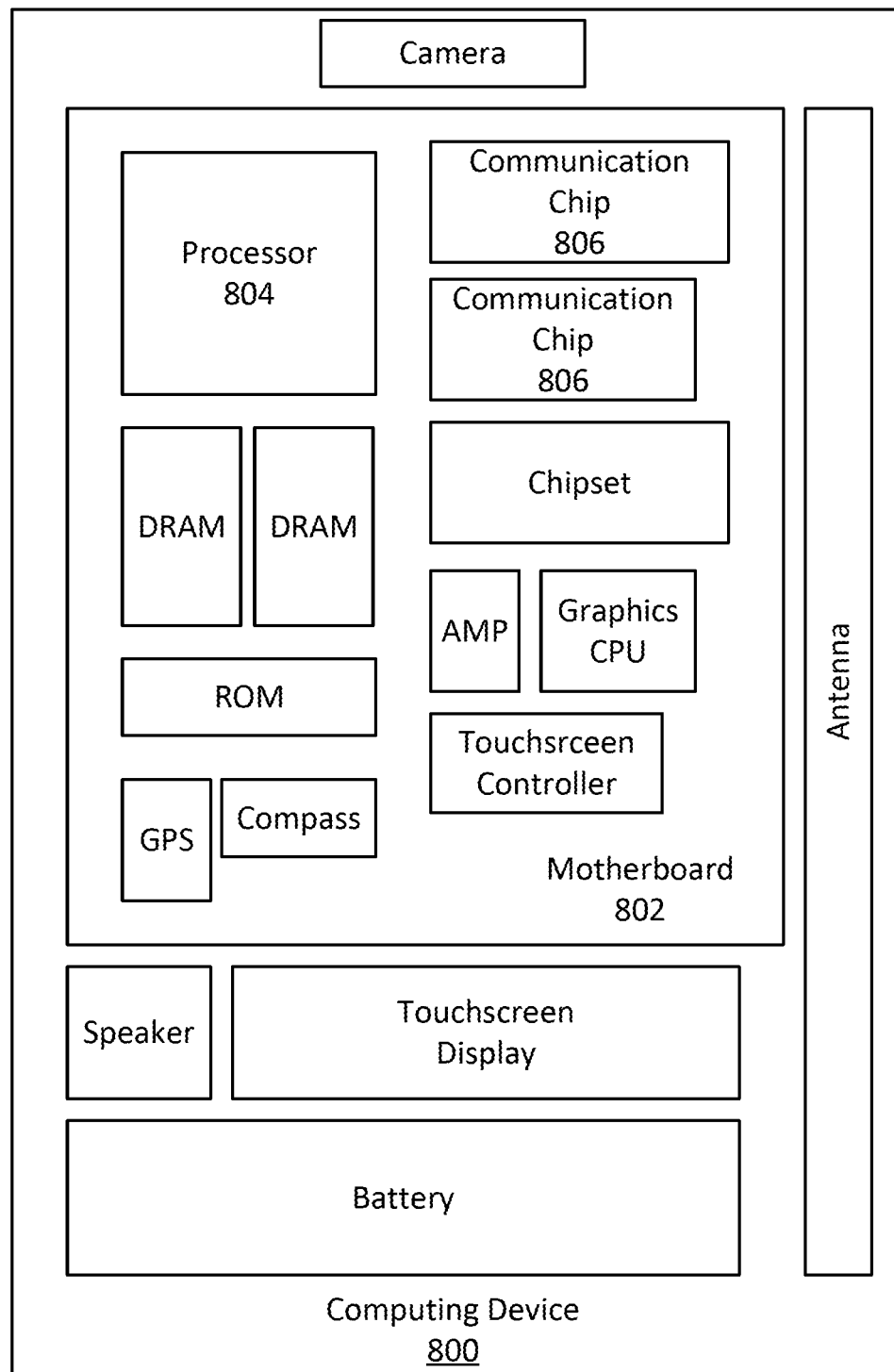
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more 2S-1C a cross-point DRAM arrays, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more embedded 2S-1C a cross-point DRAM arrays, in accordance with implementations of embodiments of the disclosure.

In further implementations, another component housed within the computing device 800 may contain an integrated circuit die that includes one or more 2S-1C a cross-point DRAM arrays, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include embedded non-volatile memory structures having 2S-1C a cross-point DRAM arrays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A memory device comprises a first selector and a storage capacitor in series with the first selector. A second selector is in parallel with the storage capacitor coupled between the first selector and zero volts.

Example embodiment 2: The memory device of example embodiment 1, wherein the storage capacitor is coupled to zero volts.

Example embodiment 3: The memory device of example embodiment 1 or 2, wherein the first selector and the second selector are connected via an internal node on the storage capacitor.

Example embodiment 4: The memory device of example embodiment 1-3, wherein the storage capacitor and the second selector are coupled to a bit line.

Example embodiment 5: The memory device of example embodiment 1-4 wherein the first selector is coupled to a word line and the word line is orthogonal to the bit line.

Example embodiment 6: The memory device of example embodiment 5, wherein a "1" state is written to the memory device by applying Vcc on the word line to turn on both the first selector and the second selector, and turning off Vcc to store V/2 in the storage capacitor.

Example embodiment 7: The memory device of example embodiment 5 or 6, wherein a "0" state is written to the memory device by applying −Vcc on the word line to turn on both the first selector and the second selector to store −V/2 in the storage capacitor.

Example embodiment 8: The memory device of example embodiment 5-7, wherein the memory device is read by: applying V/2 on the bit line and reading a "0" state if both the first selector and the second selector turn on, and a "1" state otherwise.

Example embodiment 9: The memory device of example embodiment 1-8, wherein the memory device comprises a 2S-1C cell.

Example embodiment 10: The memory device of example embodiment 9, wherein the memory device comprises an array of 2S-1C cells that form a cross-point DRAM array.

Example embodiment 11: The memory device of example embodiment 10, wherein plurality of storage capacitors in the cross-point DRAM array are connected together through respective outer cylinders and tied two zero volts at an edge of the cross-point DRAM array.

Example embodiment 12: A cross-point array comprises a first plurality of conductive lines along a first direction on a substrate. A second plurality of conductive lines is along a second direction on the substrate orthogonal to the first direction. A plurality of individual memory elements located at each cross-section of the first plurality of conductive lines and the second plurality of conductive lines. Each of the memory elements includes a first selector, a storage capacitor in series with the first selector, and a second selector in parallel with the storage capacitor coupled between the first selector and zero volts.

Example embodiment 13: The cross-point array of example embodiment 12, wherein the storage capacitor is coupled to zero volts.

Example embodiment 14: The cross-point array of example embodiment 11 or 12, wherein the first selector and the second selector are connected via an internal node on the storage capacitor.

Example embodiment 15: The cross-point array of example embodiment 12-14, wherein the storage capacitor and the second selector are coupled to one of the second plurality of conductive lines, and wherein the second plurality of conductive lines comprises bit lines.

Example embodiment 16: The cross-point array of example embodiment 12-15, wherein the storage capacitor is coupled to zero volts.

Example embodiment 17: The cross-point array of example embodiment 12-16, wherein a "1" state is written to one of the memory elements by applying Vcc on the word line to turn on both the first selector and the second selector, and turning off Vcc to store V/2 in the storage capacitor.

Example embodiment 18: The cross-point array of example embodiment 12-17, wherein a "0" state is written to one of the memory elements by applying −Vcc on the word line to turn on both the first selector and the second selector to store −V/2 in the storage capacitor.

Example embodiment 19: The cross-point array of example embodiment 12-18, wherein one of the memory elements is read by: applying V/2 on the bit line and reading a "0" state if both the first selector and the second selector turn on, and a "1" state otherwise.

Example embodiment 20: A method of fabricating a 2S-1C cross-point DRAM array comprises forming bit lines, and forming a first plurality of vias and bypass selectors over the bit lines. An interior level dielectrics (ILD) layer is deposited and trenches are formed in the ILD. Storage capacitors are formed by forming respective outer cylinder metal layers in the trenches, forming respective middle cylinder dielectric layers in the trenches conformal to walls of the outer cylinder metal layers; and forming respective and are cylinder metal layers in the trench is conformal to walls of the metal cylinder dielectric layers. A second plurality of vias and access selectors are formed over respective storage capacitors, and word lines are formed on the second plurality of vias.

Example embodiment 21: The cross-point DRAM array of example embodiment 20, further comprising coupling the first plurality of vias to the bit lines and coupling the bypass selectors between the first plurality of vias and the storage capacitors.

Example embodiment 22: The cross-point DRAM array of example embodiment 20 or 21, further comprising coupling the access selectors to the storage capacitors, and coupling the second plurality of vias to the access selectors.

Example embodiment 23: The cross-point DRAM array of example embodiment 20-22, further comprising forming at least one of the access selectors and the bypass selectors from one of: a ferroelectric oxide material, an insulator metal transition material, a chalcogenides material, and a semiconducting oxide material.

Example embodiment 24: The cross-point DRAM array of example embodiment 20-23, further comprising forming the access selector and the bypass selector with a different material type.

Example embodiment 25: The cross-point DRAM array of example embodiment 20-24, further comprising forming the 2S-1C cross-point DRAM array with $4F^2$ or less density.

What is claimed is:

1. A transistor-less memory device, comprising:
   a first selector;
   a storage capacitor in series with the first selector; and
   a second selector in parallel with the storage capacitor coupled between the first selector and zero volts, wherein a "1" state is written to the memory device by applying Vcc on the word line to turn on both the first selector and the second selector, and turning off Vcc to store V/2 in the storage capacitor.

2. The transistor-less memory device of claim 1, wherein the storage capacitor is coupled to zero volts.

3. The transistor-less memory device of claim 1, wherein the first selector and the second selector are connected via an internal node on the storage capacitor.

4. The transistor-less memory device of claim 1, wherein the storage capacitor and the second selector are coupled to a bit line.

5. The transistor-less memory device of claim 1, wherein the first selector is coupled to a word line and the word line is orthogonal to the bit line.

6. The transistor-less memory device of claim 5, wherein a "0" state is written to the memory device by applying –Vcc on the word line to turn on both the first selector and the second selector to store –V/2 in the storage capacitor.

7. The transistor-less memory device of claim 5, wherein the memory device is read by: applying V/2 on the bit line and reading a "0" state if both the first selector and the second selector turn on, and a "1" state otherwise.

8. The transistor-less memory device of claim 1, wherein the memory device comprises a 2S-1C cell.

9. The transistor-less memory device of claim 8, wherein the memory device comprises an array of 2S-1C cells that form a cross-point DRAM array.

10. The transistor-less memory device of claim 9, wherein plurality of storage capacitors in the cross-point DRAM array are connected together through respective outer cylinders and tied to zero volts at an edge of the cross-point DRAM array.

11. A transistor-less cross-point array, comprising:
    a first plurality of conductive lines along a first direction on a substrate;
    a second plurality of conductive lines along a second direction on the substrate orthogonal to the first direction;
    a plurality of individual memory elements, a respective one of the plurality of individual memory elements located at each cross-section of the first plurality of conductive lines and the second plurality of conductive lines, one of the memory elements including:
    a first selector;
    a storage capacitor in series with the first selector; and
    a second selector in parallel with the storage capacitor coupled between the first selector and zero volts, wherein a "0" state is written to one of the memory elements by applying –Vcc on the word line to turn on both the first selector and the second selector to store –V/2 in the storage capacitor.

12. The transistor-less cross-point array of claim 11, wherein the storage capacitor is coupled to zero volts.

13. The transistor-less cross-point array of claim 11, wherein the first selector and the second selector are connected via an internal node on the storage capacitor.

14. The transistor-less cross-point array of claim 11, wherein the storage capacitor and the second selector are coupled to one of the second plurality of conductive lines, and wherein the second plurality of conductive lines comprises bit lines.

15. The transistor-less cross-point array of claim 11, wherein the first selector is coupled to one of the first plurality of conductive lines, and wherein the first plurality of conductive lines comprises word lines.

16. The transistor-less cross-point array of claim 15, wherein a "1" state is written to one of the memory elements by applying Vcc on the word line to turn on both the first selector and the second selector, and turning off Vcc to store V/2 in the storage capacitor.

17. The transistor-less cross-point array of claim 15, wherein one of the memory elements is read by: applying V/2 on the bit line and reading a "0" state if both the first selector and the second selector turn on, and a "1" state otherwise.

18. A method of fabricating a 2S-1C cross-point DRAM array, the method comprising:
    forming bit lines;
    forming a first plurality of vias and bypass selectors over the bit lines;
    depositing an interior level dielectrics (ILD) layer and forming trenches in the ILD; forming the storage capacitors by:
      forming respective outer cylinder metal layers in the trenches;
      forming respective middle cylinder dielectric layers in the trenches conformal to walls of the outer cylinder metal layers; and
      forming respective and are cylinder metal layers in the trench is conformal to walls of the metal cylinder dielectric layers;
    forming a second plurality of vias and access selectors over respective storage capacitors; and
    forming word lines on the second plurality of vias.

19. The method of claim 18, further comprising coupling the first plurality of vias to the bit lines and coupling the bypass selectors between the first plurality of vias and the storage capacitors.

20. The method of claim 18, further comprising coupling the access selectors to the storage capacitors, and coupling the second plurality of vias to the access selectors.

21. The method of claim 18, further comprising forming at least one of the access selectors and the bypass selectors from one of:
    a ferroelectric oxide material, an insulator metal transition material, a chalcogenides material, and a semiconducting oxide material.

22. The method of claim 18, further comprising forming the access selector and the bypass selector with a different material type.

23. The method of claim 18, further comprising forming the 2S-1C cross-point DRAM array with $4F^2$ or less density.

* * * * *